United States Patent
Yonezawa et al.

(10) Patent No.: US 6,474,538 B1
(45) Date of Patent: Nov. 5, 2002

(54) BONDING APPARATUS AND BONDING METHOD

(75) Inventors: Takahiro Yonezawa, Osaka-fu; Akihiro Yamamoto, Hyogo-ken; Hiroyuki Kiyomura, Osaka-fu; Tetsuya Tokunaga, Kadoma; Tatsuo Sasaoka, Osaka-fu; Masahiko Hashimoto, Tokyo, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/691,247

(22) Filed: Oct. 19, 2000

(30) Foreign Application Priority Data

Oct. 22, 1999 (JP) .......................................... 11-300879

(51) Int. Cl.⁷ .......................... B23K 31/02; B23K 37/00
(52) U.S. Cl. ....................... 228/262; 228/4.5; 228/180.5
(58) Field of Search ............................ 228/262, 180.5, 228/256, 1.1, 4.1, 4.5, 904

(56) References Cited

U.S. PATENT DOCUMENTS

| | | | | |
|---|---|---|---|---|
| 3,695,501 A | * | 10/1972 | Radobenko | 219/56.21 |
| 4,266,710 A | * | 5/1981 | Bilane et al. | 219/56.1 |
| 4,340,166 A | * | 7/1982 | Bilane et al. | 228/102 |
| 4,475,681 A | * | 10/1984 | Ingle | 219/56.21 |
| 4,558,596 A | * | 12/1985 | McBrearty et al. | 228/1.1 |
| 4,619,395 A | * | 10/1986 | Amorosi et al. | 228/4.5 |
| 4,653,681 A | * | 3/1987 | Dreibelbis et al. | 228/102 |
| 5,458,280 A | * | 10/1995 | Nishimaki et al. | 228/102 |
| 5,586,713 A | * | 12/1996 | Arita et al. | 228/102 |
| 5,685,476 A | * | 11/1997 | Miyoshi | 228/180.5 |
| 5,971,254 A | * | 10/1999 | Naud et al. | 228/180.5 |

FOREIGN PATENT DOCUMENTS

JP             363155627 A    *  6/1988

* cited by examiner

*Primary Examiner*—Tom Dunn
*Assistant Examiner*—Zidia Pittman
(74) *Attorney, Agent, or Firm*—Wenderoth, Lind & Ponack, L.L.P.

(57) ABSTRACT

A higher speed moving device moves a capillary at high speed. A low inertial moving and pressing device moves and presses the capillary with low inertia. The high speed motion, and the moving and pressing motion with the low inertia are carried out independently of each other. Thus, an inertia at the low inertial moving and pressing device is reduced, whereby an impact force when a melt ball is driven by the low inertial moving and pressing device into contact with an electrode of a semiconductor integrated circuit is restricted, thus enabling stable formation for minute bumps. On the other hand, operations other than pressing the melt ball to the electrode and joining the melt ball are conducted by driving the capillary by the higher speed moving device, so that productivity is improved.

27 Claims, 12 Drawing Sheets

BONDING APPARATUS AND BONDING METHOD

BACKGROUND OF THE INVENTION

1. Field of the Invention

The present invention relates to a bonding apparatus and a bonding method performed with the bonding apparatus. The bonding apparatus involves apparatuses such as a bump bonding apparatus for forming projecting electrodes on semiconductor integrated circuits (referred to as ICs hereinafter) in fabricating flip chip type ICs, and a wire bonding apparatus for connecting the ICs with substrate electrodes via a gold wire, or the like.

2. Description of the Related Art

A stud bump bonding technique has been known, which is a technique for joining gold bumps to electrode formed points on flip chip ICs with ultrasound supplied by adopting a wire bonding technique of the ICs. The stud bump bonding technique will be described below.

A generally used conventional bump bonding apparatus is shown in FIG. 12, for example. In this bump bonding apparatus, a gold wire 1 is held by a clamper 2 and passed through a capillary 3. The capillary 3 is provided at a leading end part of an ultrasonic horn 4, which is disposed on a supporting frame 5 that is swingable via a horizontal axial center 5a. The supporting frame 5 is moved in a direction of an arrow 21 by ahead up-down driving device 6, whereby the capillary 3 is moved up and down via the ultrasonic horn 4. A voice coil motor is used as the head up-down driving device 6. The ultrasonic horn 4 has an ultrasonic oscillator 7.

The supporting frame 5 is provided on a moving table 8 that is movable in X-Y directions which are orthogonal to each other in a horizontal direction. Thus, the capillary 3 is moved in the horizontal direction through movement of the moving table 8. 9 is a detecting sensor for detecting a positional change in an up-down direction of the supporting frame 5. A position in an up-down direction of the capillary 3 is obtained on a basis of output information from the detecting sensor 9.

Above the clamper 2 is arranged an air tensioner 10 for drawing the gold wire 1 upwardly. On the other hand, a heat stage 12 is disposed under the capillary 3 for holding and heating an IC 11. A spark generating device 14 set in a vicinity of a leading end of the gold wire 1, which is inserted into the capillary 3, generates a spark between the device 14 and the leading end of the gold wire, thereby melting the gold wire 1 and forming a gold ball 16. A camera device 15 for recognizing a position of the IC 11 is installed above the heat stage 12.

The conventional bump bonding apparatus in the above constitution operates in a manner as described below.

First, a spark is applied from the spark generating device 14 to the leading end of the gold wire 1 that extends downwardly from the capillary 3, whereby the gold ball 16 is formed. The IC 11 on the heat stage 12 is recognized by the camera device 15 and then, based on information obtained the recognizing operation, the gold ball 16 is positioned by driving the moving table 8.

Next, the capillary 3 is moved downwardly by the head up-down driving device 6. Then, when the gold ball 16 comes into contact with an electrode formation point of the IC 11 from above the electrode formation point, an up-down shift of the supporting frame 5 detected by the detecting sensor 9 remains at a constant value, whereby a position of the electrode formation point of the IC 11 is detected. A predetermined force is impressed to the capillary 3 to press the gold ball 16 downwardly. Further, ultrasonic wave oscillation is applied via the ultrasonic horn 4 from the ultrasonic oscillator 7 to join the gold ball 16 to the electrode formation point of the IC 11. A bump is thus formed at the electrode formation point of the IC 11. Thereafter, the capillary 3 is moved upwardly a fixed distance by the head up-down driving device 6 and, the gold wire 1 is pulled up by the head up-down driving device 6 with the wire 1 being held by the damper 2. As a result, the gold wire 1 on the bump is cut at a recrystallization boundary zone in the gold wire produced by the spark, thereby forming a projecting bump 17 on the electrode formation point of the IC 11.

However, a pitch of electrodes on the IC becomes narrower and consequently a diameter at a base of the bump becomes 65 $\mu$m or smaller. That is, the size of the bump is getting smaller. Thus, the following problems arise. Specifically, when the gold ball 16 comes into contact with the electrode formation point of the IC 11 from above of the electrode formation point, a total inertia of the damper 2, capillary 3, ultrasonic horn 4, ultrasonic oscillator 7, supporting frame 5, head up-down driving device 6, and shift detecting sensor 9 is applied as an impact force to the gold ball 16. Thus, as the bump becomes smaller in size, the impact force is large enough to crush the gold ball 16. Thereafter, by applying the ultrasonic wave oscilation to the bump, a problem in that a predetermined height of the bump cannot be obtained results.

On the other hand, in order to restrict the above impact force, if the speed of the capillary 3 is lowered when the gold ball 16 comes into contact with the electrode formation point of the IC 11, a problem in that production cycle time is disadvantageously lengthy results. Even in the case of normal bumps having a diameter of 65–90 $\mu$m, the same problem results if the speed of the capillary 3 is increased, so as to shorten the production cycle time when the gold ball 16 comes into contact with the electrode formation point of the IC 11.

SUMMARY OF THE INVENTION

The present invention is accomplished in order to eliminate the above-described problems. An object of the present invention is therefore to provide a bonding apparatus which can shorten a bump formation time and form bumps stably, and also to provide a bonding method performed with the bonding apparatus.

In order to achieve the aforementioned objective, a bonding apparatus is provided according to a first aspect of the present invention, which comprises:

a reduced inertial moving and pressing device having a wire guide member for guiding a wire having a melt ball at a leading end thereof, and a driving part, for moving the wire guide member together with the melt ball from a location that corresponds to the position of melt ball immediately before the melt ball touches an electrode of a semiconductor integrated circuit, and for pressing and joining the melt ball to the electrode; and a higher speed moving device for moving a move frame having the reduced inertial moving and pressing device;

wherein the reduced inertial moving and pressing device is moved together with the higher speed moving device at a higher speed to the location that corresponds to the position of the melt ball immediately before the melt ball touches the electrode, and is then moved from this location to the electrode at a speed lower than the higher speed, with an inertia caused by the higher speed movement of the reduced inertial moving and pressing device being reduced.

The reduced inertial moving and pressing device can further include an ultrasonic oscillation device set to the wire guide member for ultrasonically oscillating the melt ball via the wire guide member when the melt ball is pressed to the electrode.

The reduced inertial moving and pressing device may be set to the move frame so as to move relatively to the move frame for reducing the inertia of the reduced inertial moving and pressing device.

In an arrangement, the reduced inertial moving and pressing device may have the wire guide member disposed at one end part of the reduced inertial moving and pressing device, and the driving part disposed at another end part thereof. The reduced inertial moving and pressing device is set to the move frame with the wire guide member and the driving part being rocked via an oscillating shaft that is set to the move frame.

The ultrasonic oscillation device may be arranged separately from the move frame, while having a transmitting member for transmitting ultrasonic oscillation generated at the ultrasonic oscillation device to the wire guide member.

In the bonding apparatus, the move frame may have the reduced inertial moving and pressing device at one end part of the move frame and the higher speed moving device at another end part thereof The move frame is rocked via a frame oscillation shaft. The higher speed moving device has a cam mechanism set to the another end part for rocking the move frame, with the oscillating shaft of the reduced inertial moving and pressing device being arranged at a balanced position where the oscillating shaft balances with the frame oscillation shaft in terms of inertia.

According to a second aspect of the present invention, there is provided a bonding apparatus which comprises:

a moving device which moves a move frame having a wire guide member at a second speed to a location that corresponds to the position of a melt ball immediately before the melt ball, formed at a wire leading end projecting from the wire guide member, touches an electrode of a semiconductor integrated circuit, moves the move frame towards the electrode at a first speed lower than the second speed, and causes the wire guide member to press and join the melt ball to the electrode after the melt ball touches the electrode of the semiconductor integrated circuit;

an ultrasonic oscillation device set separately from the move frame for ultrasonically oscillating the melt ball when the melt ball is being pressed to the electrode; and a transmitting member for transmitting the ultrasonic oscillation generated by the ultrasonic oscillation device to the wire guide member so as to ultrasonically oscillate the melt ball.

According to a third aspect of the present invention, there is provided a bonding method comprising:

moving a melt ball at a second speed towards an electrode of a semiconductor integrated circuit until the melt ball reaches a locationn that corresponds to a position of the melt ball immediately before the melt ball touches the electrode; and after the melt ball reaches this location, moving, pressing and joining the melt ball to the electrode at a first speed lower than the second speed with a lower inertia produced by reducing a higher inertia resulting from the movement at the second speed.

According to the bump bonding apparatus in the first aspect of the present invention as is fully described hereinabove, the higher speed moving device, and the reduced inertial moving and pressing device are set. The operation of moving the wire guide member at high speed with the higher speed moving device, and the operation of pressing and moving the wire guide member with low inertia are performed, independently and separately of each other. Thus, since the inertia at the reduced inertial moving and pressing device is reduced, the impact force, when the formed melt ball projecting from the wire guide, member is driven by the reduced inertial moving and pressing device and comes into contact with the electrode of the semiconductor integrated circuit, is restricted. Accordingly, minute bumps can be stably formed, and can be prevented from being defective in shape while improved in quality. Meanwhile, the operation other than pressing and joining the melt ball to the electrode is carried out by driving the wire guide member by the higher speed moving device, so that productivity is improved without increasing production cycle time.

The reduced inertial moving and pressing device is provided with the ultrasonic oscillation device. The ultrasonic oscillation device applies ultrasonic oscillation to the melt ball when the melt ball is being pressed to the electrode. The melt ball can accordingly be joined to the electrode more easily and firmly.

Since the reduced inertial moving and pressing device swings via the oscillating shaft which is set at the balanced position to balance with the frame oscillation shaft of the move frame in terms of inertia, effects of the wire guide member onto the reduced inertial moving and pressing device are eliminated, thereby further contributing to the above-mentioned stable formation of minute bumps and productivity improvement.

When the ultrasonic oscillation device is set separately from the move frame, the inertia of the reduced inertial moving and pressing device is reduced even more, thereby contributing to the stable formation of minute bumps and improvement in productivity.

According to the bump bonding apparatus in the second aspect of the present invention, the moving device for the wire guide member and the ultrasonic oscillation device are eliminated from the move frame, so that the inertia of the move frame is reduced. The high speed movement of the melt ball, and the pressing and movement of the melt ball with low inertia can be performed by one moving device. Further, the stable formation of minute bumps and productivity improvement can be realized.

BRIEF DESCRIPTION OF THE DRAWINGS

These and other objects and features of the present invention will become clear from the following description taken in conjunction with the preferred embodiments thereof with reference to the accompanying drawings in which.

DETAILED DESCRIPTION OF THE PREFERRED EMBODIMENTS

Figure 1:
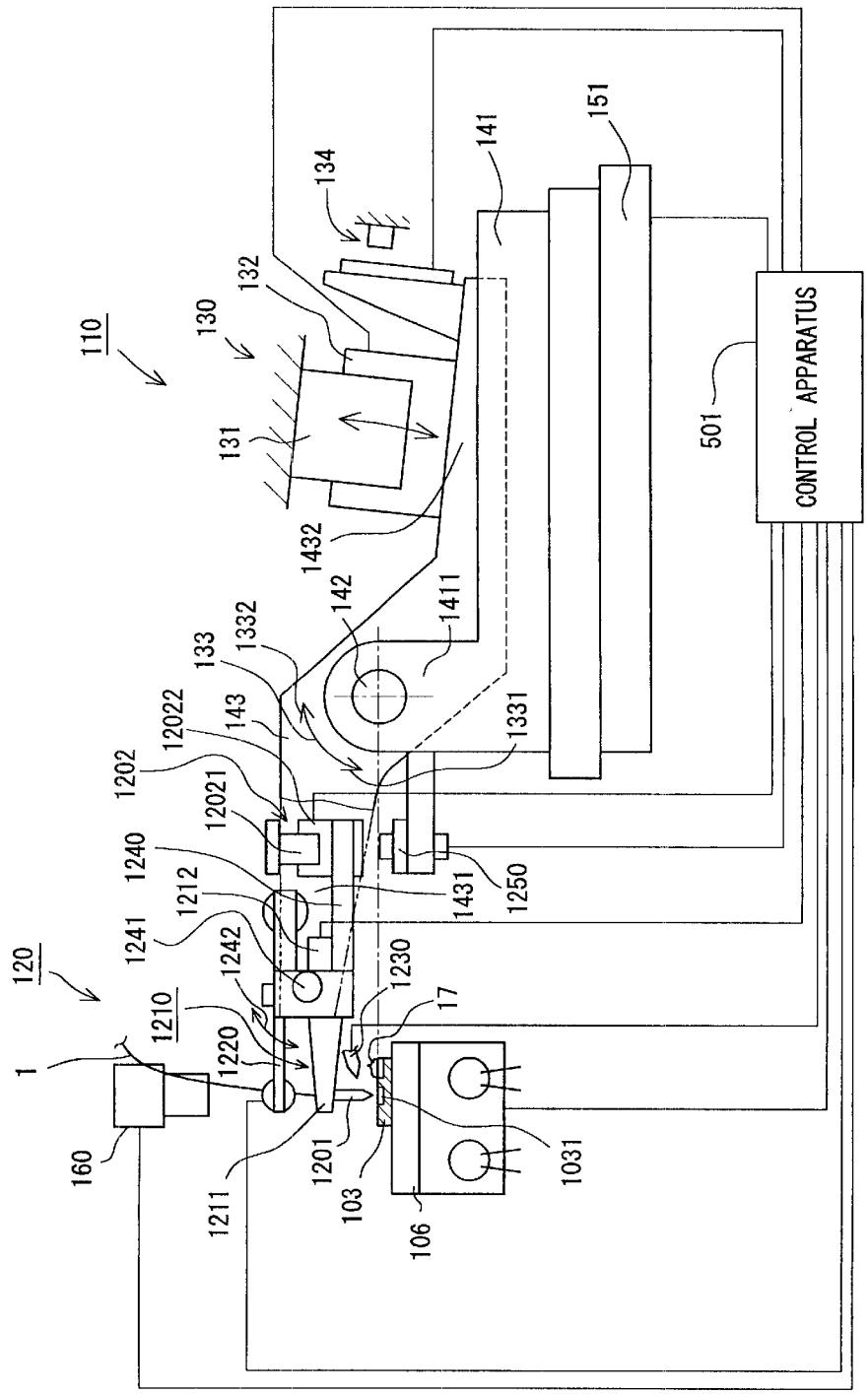
FIG. 1 is a diagram of a bump bonding apparatus according to a first embodiment of the present invention.

A bonding apparatus and a bonding method carried out with the bonding apparatus according to the present invention will be described hereinbelow with reference to the drawings throughout which like parts are designated by like reference numerals. In each of embodiments, the bonding apparatus takes a bump bonding apparatus as an example which forms bumps to electrodes on a semiconductor integrated circuit mounted on a substrate with flip-chip mounting. However, the present invention is not limited to the bump bonding apparatus and is applicable, e.g., to a bonding apparatus such as a wire bonding apparatus or the like which melts a leading end of a gold wire or a like wire, forms a melt ball, and joins the melt ball to the electrode.

FIRST EMBODIMENT

Figure 9:
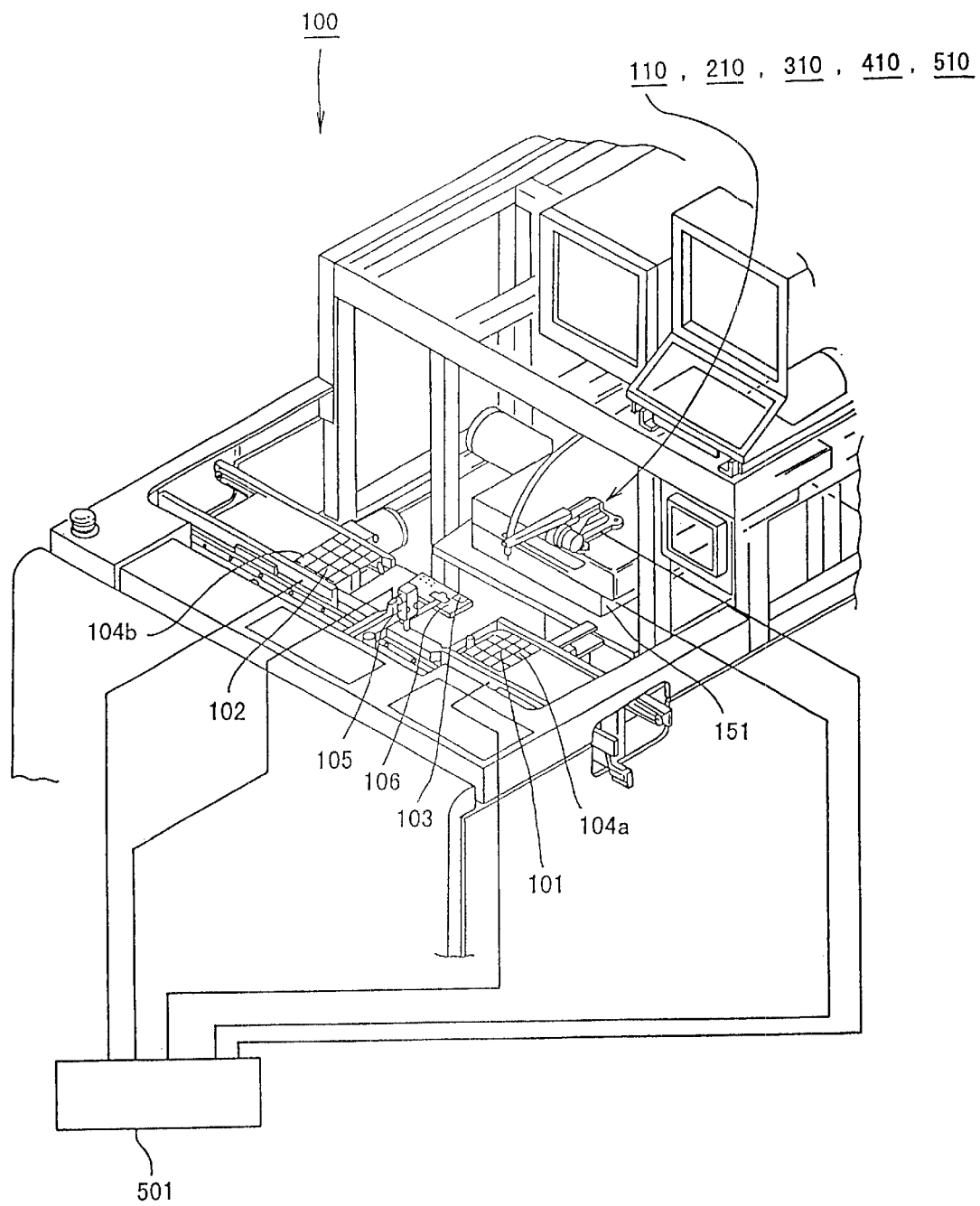
FIG. 9 is a perspective view of a bump forming apparatus provided with the bump bonding apparatus in each of the embodiments of the present invention.

FIG. 9 indicates a bump forming apparatus provided with a bump bonding apparatus 110, 210, 310, 410, and 510 according to each embodiment of the present invention to be described below. The bump forming apparatus 100 includes, in addition to the bump bonding apparatus, a carry-in apparatus 101 for carrying to the bump forming apparatus 100 trays 104a in which semiconductor integrated circuits 103 are stored, a bump formation stage 106 for holding the semiconductor integrated circuits 103 placed thereon and heating the semiconductor integrated circuits 103 to a temperature necessary for forming bumps, a carry-out apparatus 102 for carrying out trays 104b in which integrated circuits with formed bumps are stored, a semiconductor component transfer apparatus 105 for transferring the semiconductor integrated circuits 103 from the trays 104a to the bump formation stage 106 and transferring the integrated circuits with the bumps from the bump formation stage 106 to the trays 104b, and a control apparatus 501 for controlling operations of these parts. The bump bonding apparatus 110 will be detailed hereinbelow.

Figure 5:
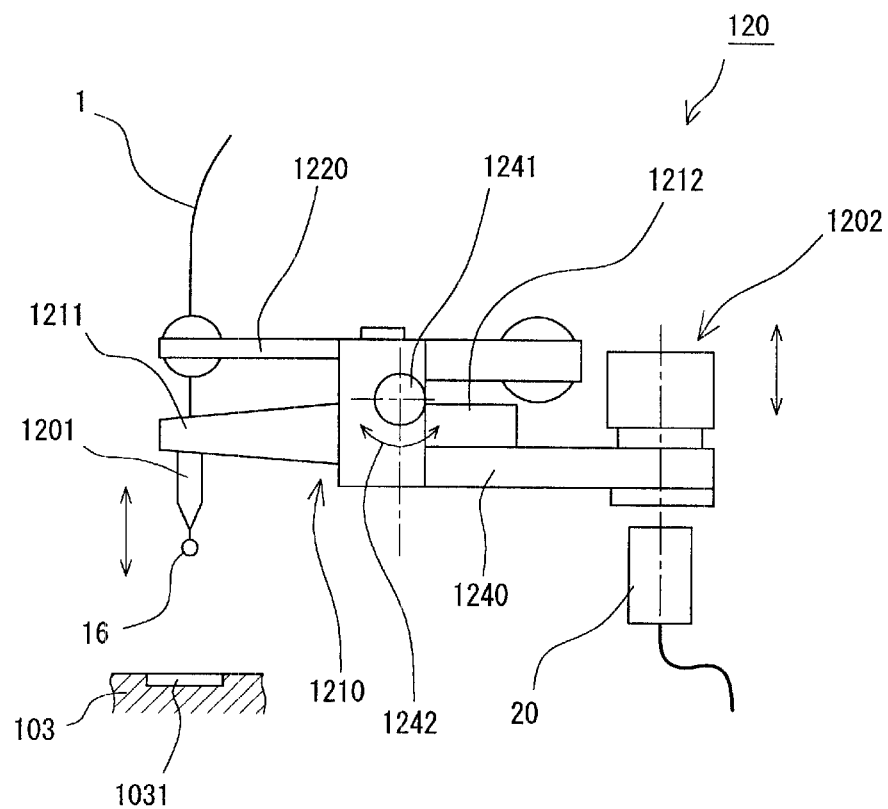
FIG. 5 is an enlarged view of a low inertial moving and pressing device part included in the bump bonding apparatus of FIGS. 1 and 3.

As shown in FIG. 1, the bump bonding apparatus 110, roughly speaking, has a low inertial moving and pressing device, corresponding to a reduced inertial moving and pressing device, 120 which is shown in detail in FIG. 5, and a higher speed moving device 130. The low inertial moving and pressing device 120 is set to one end part 1431 of a move frame 143 which can oscillate in a direction about an axis of a frame oscillation shaft 142 extending in a horizontal direction. The higher speed moving device 130 is set to another end part 1432 of the move frame 143. The frame oscillation shaft 142 is supported by a supporting member 1411 standing at a base plate 141. The base plate 141 is mounted on a moving table 151 that is movable in X-Y directions which are orthogonal to each other in the horizontal direction. Therefore, the bump bonding apparatus 110 can be moved in the X-Y directions by moving the moving table 151 in the X-Y directions.

According to the embodiment, the higher speed moving device 130 is constituted of a voice coil motor having a magnet 131 and a coil 132. For example, the magnet 131 is set to a frame different from the move frame 143 while the coil 132 is set to the move frame 143. Thus, when electricity is supplied to the coil 132, a driving force is generated at the higher speed moving device 130, thereby rocking the move frame 143 about the axis of the frame oscillation shaft 142 in a direction of an arrow 133. According to the rocking operation, the low inertial moving and pressing device 120 set to the one end part 1431 of the move frame 143 also swings.

An amount of the rocking of the move frame 143 is detected by a shift detecting sensor 134. Since the low inertial moving and pressing device 120 is also moved by the above rocking operation, an amount of the movement in an up-down direction of a capillary 1201 of the low inertial moving and pressing device 120 is obtained by the control apparatus 501 based on information detected by the shift detecting sensor 134.

The low inertial moving and pressing device 120 has, in addition to the capillary 1201 which corresponds to a wire guide member for guiding a gold wire 1, as an example of the wire, a driving part 1202 for moving the capillary 1201, an ultrasonic oscillation device 1210, and a damper 1220 for holding the gold wire 1. The ultrasonic oscillation device 1210 is equipped with an ultrasonic horn 1211 having the capillary 1201 set to a leading end part thereof and an ultrasonic oscillator 1212 secured to the ultrasonic horn 1211. The capillary 1201, the ultrasonic oscillation device 1210, and the damper 1220 are installed to a supporting frame 1240 of the low inertial moving and pressing device 120. In the above-constituted low inertial moving and pressing device 120, the capillary 1201 is disposed at a side of one end of the device 120 while the driving part 1202 is arranged at a side of the other end of the device 120. The device 120 is set to the move frame 143 in a state in which the capillary 1201 and driving part 1202 can swing in a direction about an axis of an oscillating shaft 1241 supported by the move frame 143 and extending in the horizontal direction. Thus, the low inertial moving and pressing device 120 can be moved relative to the move frame 143 for reducing the inertia, caused by the operation of the higher speed moving device 130, of the low inertial moving and pressing device 120. More specifically, the driving part 1202 is constructed with a voice coil motor having a magnet 12021 and a coil 12022 in this embodiment. For instance, the magnet 12021 is set to the move frame 143 and the coil 12022 is set to an end of the supporting frame 1240. Supplying electricity to the coil 12022 produces a driving force from the driving part 1202, thereby rocking the supporting frame 1240 in a direction of an arrow 1242 about an axis of oscillating shaft 1241. As a result, the capillary 1201 is moved up or down via the ultrasonic horn 1211 set to the supporting frame 1240, and carries out a pressing operation due to movement toward the semiconductor integrated circuit 103.

The oscillating shaft 1241 is arranged at a balanced position to balance with the frame oscillation shaft 142 of the move frame 143 in terms of inertia. Namely, the balanced position is a position where a first inertia produced at the side of one end of the device 120 and a second inertia produced at the side of the other end of the device 120 are balanced with each other. The first and second inertias are produced by the swinging operation of the move frame 143 about the axis of the frame oscillation shaft 142. Moreover, as shown, e.g., in FIG. 1, a bump form face of the semiconductor integrated circuit 103 placed on the bump formation stage 106 is kept at an equal heightwise position relative to a center position of the frame oscillation shaft 142. According to this arrangement of the bump form face and the center position of the shaft 142, after the bump is formed, immediately after the move frame 143 starts to move in the arrow direction 133 about the axis of the frame oscillation shaft 142, a leading end of the capillary 1201 moves in a perpendicular direction to the bump form face. Thus, the arrangement can prevent a formed bump from being deformed.

An amount of swing of the low inertial moving and pressing device 120 about the axis of the oscillating shaft 1241, more strictly, an amount of the movement in the up-down direction of the supporting frame 1240 is detected by a shift detecting sensor 1250. An amount of movement in the up-down direction of the capillary 1201 is obtained by the control apparatus 501 based on the above-obtained amount of movement of the supporting frame 1240. The up-down direction is a direction almost orthogonal to the horizontal direction and a rotational direction about the axis of the oscillating shaft 1241.

Figure 12:
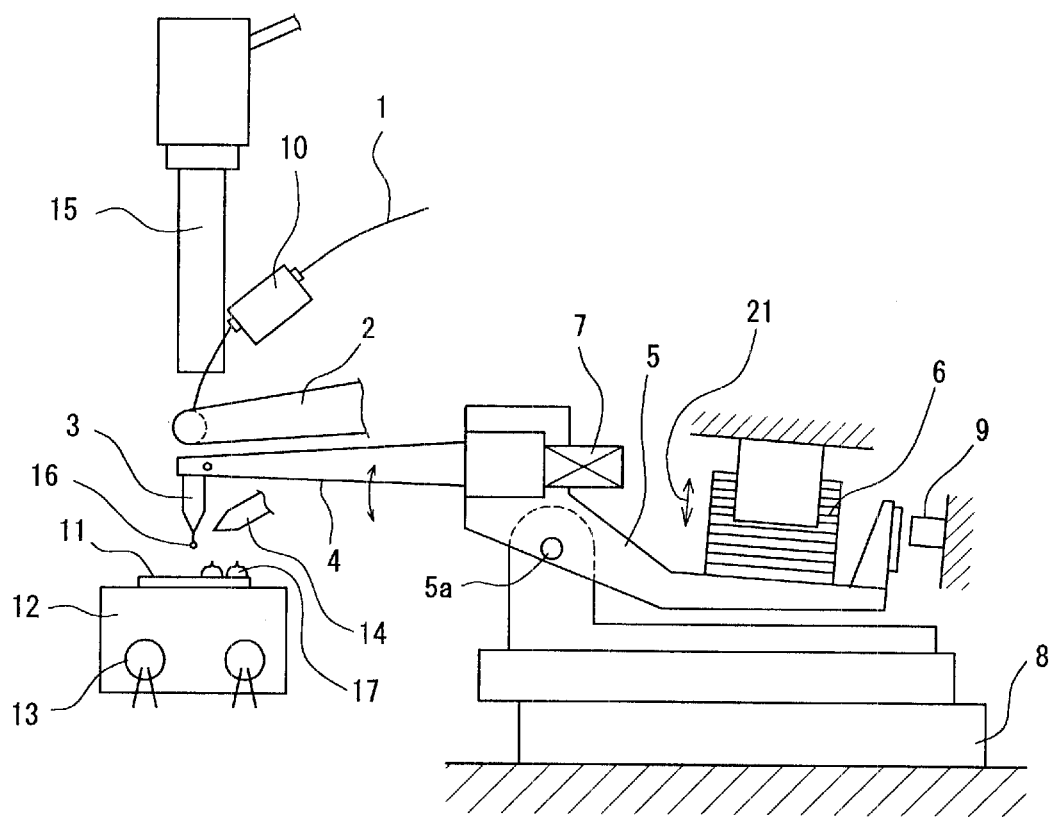
FIG. 12 is a diagram of a conventional bump bonding apparatus.

In the low inertial moving and pressing device 120 constituted as above, the gold wire 1 is held by the damper 1220 and passed through the capillary 1201. In the vicinity of the low inertial moving and pressing device 120 are arranged devices as follows. A spark generating device 1230 is set in the vicinity of a leading end part of the gold wire 1 projecting from the capillary 1201, which generates a spark between the device 1230 and the leading end of the gold wire 1, melts the leading end of the gold wire 1 and forms a melt ball 16. An air tensioner such as designated by a numeral 10 in FIG. 12 for drawing up the gold wire 1 is set above the clamper 1220, and a position recognition camera device 160 for recognizing a position of the semiconductor integrated circuit 103 held to the bump formation stage 106 is placed above the bump formation stage 106.

In a description below, a method for bonding bumps with use of the above bump bonding apparatus 110 will be discussed among operations of the bump forming apparatus 100. Operation control of each part constituting the apparatus is executed by the control apparatus 501.

First, a spark is applied by the spark generating device 1230 to the leading end of the gold wire 1 projected downward from the capillary 1201, whereby the melt ball 16 is formed. The semiconductor integrated circuit 103 on the bump formation stage 106 is recognized by the position recognition camera device 160. The moving table 151 is moved in the X-Y directions and positioned so that the melt ball 16 is located above an electrode 1031, on which the bump is to be formed, on the semiconductor integrated circuit 103.

Figure 2:
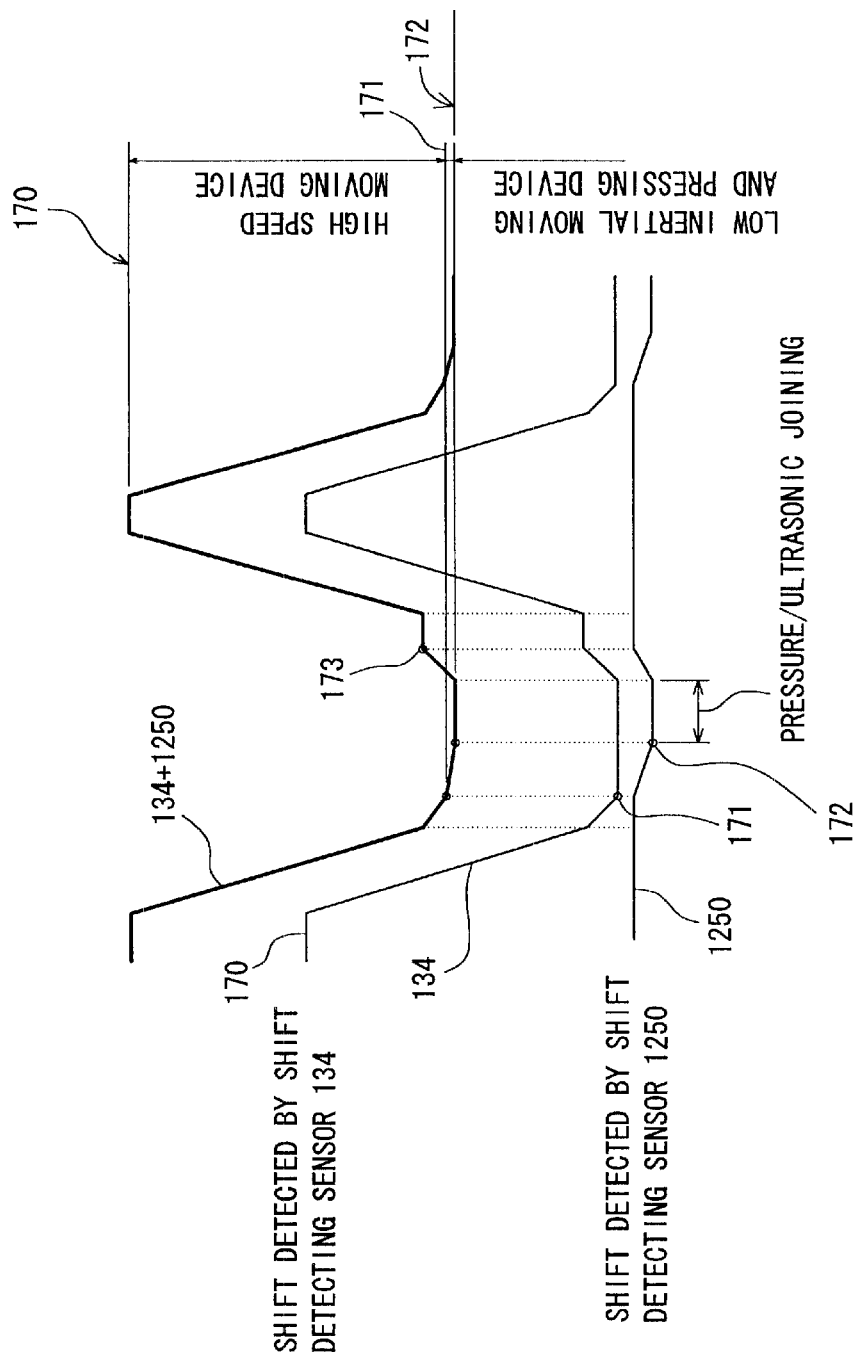
FIG. 2 is a diagram of a move locus of a capillary in a bump bonding operation carried out by the bump bonding apparatus of FIG. 1.

With reference to FIG. 2, then, the higher speed moving device 130 is driven from a spark generation height 170 to a position 171. The spark generation height 170 is a position where the spark is applied to the gold wire 1 and then the melt ball 16 is formed. The position 171 is a location that corresponds to the position of the melt ball 16 immediately before the melt ball 16 touches the electrode 1031 at a bump form point of the semiconductor integrated circuit 103. The position corresponds to, e.g., a heightwise position at the leading end of the capillary 1201. The movement amount of the capillary 1201 is obtained on the basis of detection by the shift detecting sensor 134. The operation of the higher speed moving device 130 is stopped by control of the control apparatus 501 at a point in time when the melt ball 16 reaches the position 171. In other words, due to the operation of the higher speed moving device 130, the move frame 143 swings about the axis of the frame oscillation shaft 142 in an arrow direction 1331. Therefore, the capillary 1201 of the low inertial moving and pressing device 120 set to the one end part 1431 of the move frame 143 moves from the spark generation height 170 to the position 171 at a second speed, and the melt ball 16 is positioned to a location that corresponds to the position of melt ball 16 immediately before it touches the electrode 1031.

Next, the driving part 1202 of the low inertial moving and pressing device 120 is driven in place of the higher speed moving device 130. By this operation the low inertial moving and pressing device 120 is rocked about the axis of the oscillating shaft 1241, whereby the capillary 1201 is lowered further from the position 171 at a first speed lower than the second speed. Thus the melt ball 16 comes into contact with the electrode 1031 of the semiconductor integrated circuit 103 from above the electrode 1031. A press position 172, where the melt ball 16 is pressed onto the electrode 1031, is detected when a shift of the supporting frame 1240 detected by the shift detecting sensor 1250 becomes a set value. Then, a predetermined pressure is applied to the capillary 1201 by the driving part 1202 to press the melt ball 16 downwardly. Furthermore, the pressed melt ball 16 is ultrasonically oscillated via the ultrasonic horn 1211 and capillary 1201 by generating ultrasonic oscillation by the ultrasonic oscillator 1212. The melt ball 16 is joined to the electrode 1031 at the bump form point on the semiconductor integrated circuit 103 through the above pressing and oscillation.

A force of the pressing when the melt ball 16 is pressed downwardly by the capillary 1201 is as small as approximately 0.49N, and therefore, a shift subsequent to the pressing is not indicated in FIG. 2. Nor is detection of the shift carried out at the time of pressing.

After the joining, the higher speed moving device 130 and the driving part 1202 of the low inertial moving and pressing device 120 are driven, such that the capillary 1201 is moved up to a position 173. The gold wire 1 is then held by the clamper 1220 and, the higher speed moving device 130 operates to move the capillary 1201 upwardly again to the spark generation height 170. As a result of the upward motion of the capillary 1201, the gold wire 1 is cut at a recrystallization boundary zone produced thereto as a result of heat when the melt ball 16 is formed. The projection-like bump 17 is thus formed on the electrode 1031 of the semiconductor integrated circuit 103.

According to the bump bonding apparatus 110 of the embodiment, the higher speed moving device 130 and the low inertial moving and pressing device 120 are installed respectively to carry out an operation of moving the capillary 1201 from the spark generation height 170 to the position 171, and from the position 173 to the spark generation height 170, at high speed; as well as an operation of moving and pressing the capillary 1201 from the position 171 to the press position 172 with low inertia. The aforementioned operations are performed entirely independently of each other. The above constitution reduces an inertia at the low inertial moving and pressing device 120, thereby restricting an impact force more than conventionally when the formed melt ball 16, projecting from the capillary 1201, touches the electrode 1031 of the semiconductor integrated circuit 103. Minute bumps can be formed stably, and can be prevented from failing in shape while being improved in quality.

Moreover, since the higher speed moving device 130 moves the capillary 1201 at high speed from the spark generation height 170 to the position 171, the problem of an increase in production cycle time is eliminated.

As described hereinabove, since the oscillating shaft 1241 of the low inertial moving and pressing device 120 is arranged at a balanced position to balance with the frame oscillation shaft 142 of the move frame 143 in terms of inertia, effects to the low inertial moving and pressing device 120 caused by the higher speed moving device 130 are negated. In other words, if the oscillating shaft 1241 were deviated from the balanced position, an inertial force generated at the low inertial moving and pressing device 120 as a result of the high speed motion would act an the capillary 1201. Thus, it is expected that operational control of the driving part 1202 to move the capillary 1201 at the first speed would be obstructed and stable formation of minute bumps would be hindered. Accordingly, the oscillating shaft 1241 is positioned at a position such that the inertial force generated at the low inertial moving and pressing device 120 as a result of the high speed motion does not act on the capillary 1201 in the present embodiment. The capillary 1201 can accordingly be moved at high speed by the higher speed moving device 130, whereby a bump form time can be shortened. Further, the impact when the melt ball 16 touches the electrode 1031 can be limited, thus enabling stable formation of minute bumps. In other words, since the low inertial moving and pressing device 120 can be moved independently and relatively to the move frame 143 by means of the oscillating shaft 1241, the low inertial moving and pressing device 120 can restrict the impact of the melt ball 16. Thus, the low inertial moving and pressing device 120 can be designated as an impact restricting device.

SECOND EMBODIMENT

Figure 3:
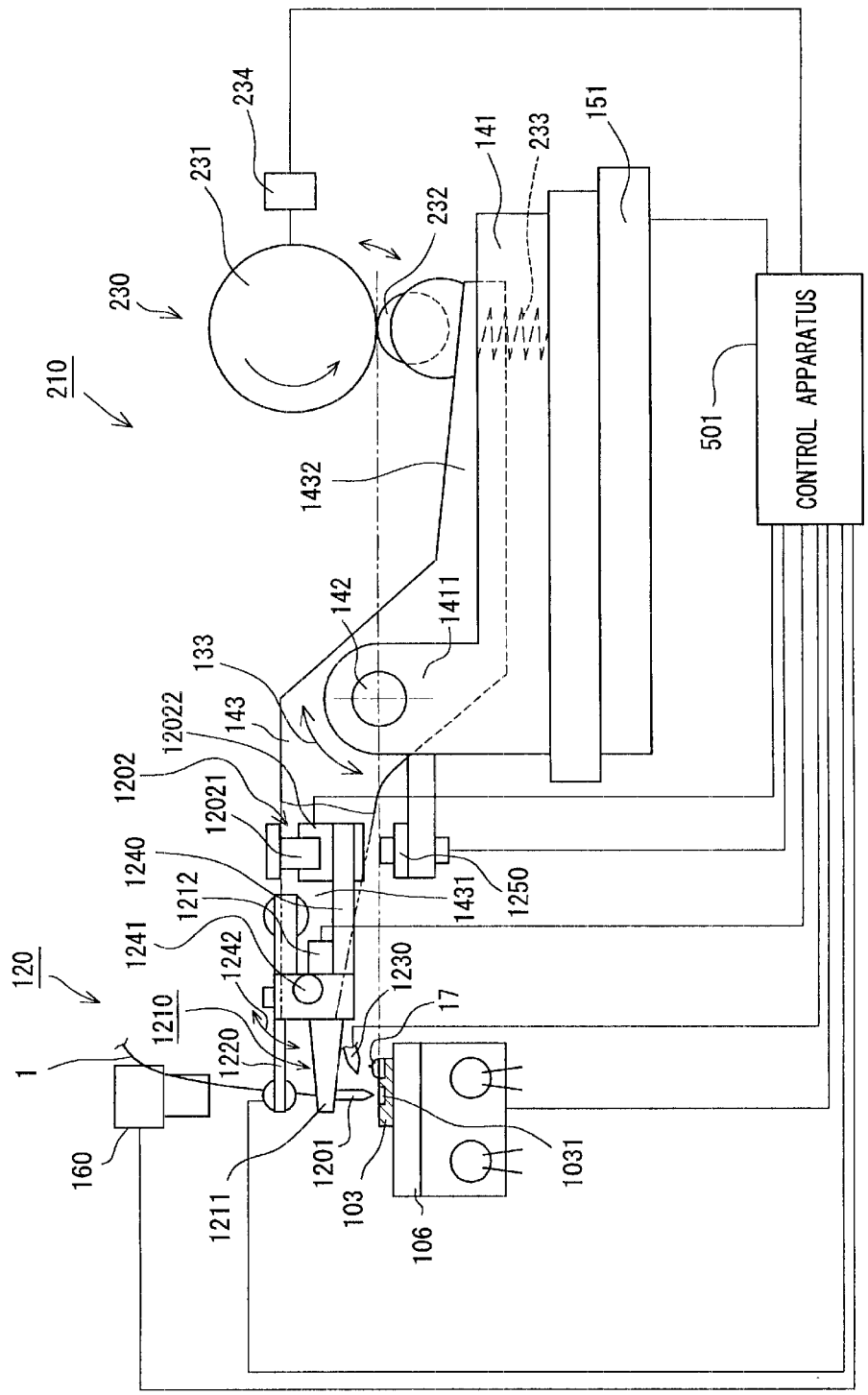
FIG. 3 is a diagram of a bump bonding apparatus according to a second embodiment of the present invention.

FIG. 3 shows a bump bonding apparatus 210 according to a second embodiment. The bump bonding apparatus 210 has a higher speed moving device 230 including a cam mechanism which replaces the higher speed moving device 130 having the voice coil motor structure of the bump bonding apparatus 110 discussed above. Other points in structure of the apparatus 210 are not different from that of the bump bonding apparatus 110, and therefore, the description of the other points will be omitted here.

The higher speed moving device 230 comprises a plate cam 231, a cam follower 232, and a cam urging spring 233. The plate cam 231 is elliptical, as illustrated, and is rotated in an arrow direction by a driving device 234, for example a motor which is controlled in operation by the control apparatus 501. The cam follower 232 is set to the other end part 1432 of the move frame 143 and is pressed in tight contact with the plate cam 231 by the cam urging spring 233. In the higher speed moving device 230 constructed above, when the plate cam 231 rotates, the move frame 143 rocks in the arrow direction 133 about the axis of the frame oscillation shaft 142, thereby driving the low inertial moving and pressing device 120 at high speed as described in the preceding first embodiment.

The operation of the bump bonding apparatus 210 in the second embodiment of the above constitution will be described now. The description below is directed to an operation related to the higher speed moving device 230, which is a specific operating part of the bump bonding apparatus 210 of the second embodiment, while other operations similar to the operations of the bump bonding apparatus 110 of the first embodiment are omitted from the description.

Figure 4:
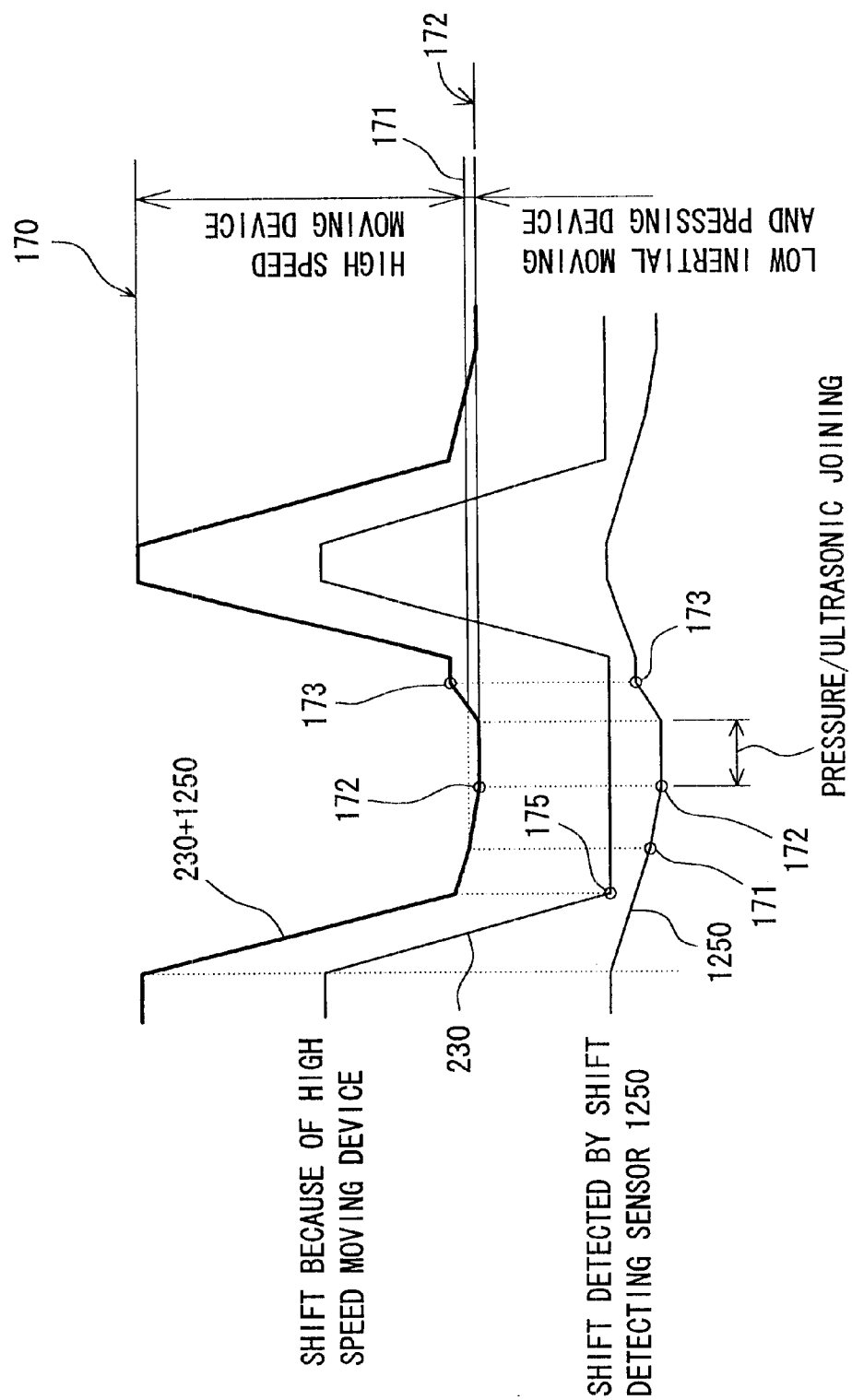
FIG. 4 is a diagram of a move locus of a capillary in a bump bonding operation carried out by the bump bonding apparatus of FIG. 3.

After the melt ball 16 is formed, as shown in FIG. 4, the higher speed moving device 230 is driven, thereby swinging the move frame 143. Thus, the low inertial moving and pressing device 120 set to the one end pail 1431 of the move frame 143 is lowered to a position 175 at a second speed.

In using the cam mechanism of the second embodiment, an amount of the swing of the move frame 143 is determined by an arrangement relationship between the plate cam 231 and cam follower 232 and an operation control by the driving device 234, and therefore, a shift detecting sensor for detecting the amount of the swing is not installed in the apparatus 210.

Simultaneously with the above driving of the higher speed moving device 230, the driving part 1202 of the low inertial moving and pressing device 120 is started. The driving part 1202 lowers the capillary 1201 to the position 171 at a first speed after the higher speed moving device 230 stops driving at the position 175. At position 171, the melt ball 16 is positioned immediately above the electrode 1031 at the bump form point of the semiconductor integrated circuit 103. The capillary 1201 is further lowered to the press position 172 by the driving part 1202. A predetermined pressure is applied to the capillary 1201 by the driving part 1202 at the press position 172, thereby pressing the melt ball 16 towards the electrode 1031. Ultrasonic oscillation is also applied to the pressed melt ball 16 by the ultrasonic oscillation device 1210, and the melt ball 16 is joined on the electrode 1031.

After the melt ball is joined as described above, the capillary 1201 is moved by the driving part 1202 by a fixed distance to the position 173. The gold wire 1 is then held by the damper 1220 and raised to the spark generation height 170 by the driving part 1202 and higher speed moving device 230. As a result, the gold wire 1 is cut at the recrystallization boundary zone, whereby the projection-shaped bump 17 is formed on the electrode 1031 of the semiconductor integrated circuit 103.

Similar to the bump bonding apparatus 110 of the earlier-described first embodiment, the bump bonding apparatus 210 of the second embodiment is provided with the higher speed moving device 230 and the low inertial moving and pressing device 120 so as to carry out, respectively and independently, the operation of moving the capillary 1201 at high speed and the operation of pressing and moving the capillary 1201 with low inertia. Accordingly, the bump bonding apparatus 210 can form minute bumps stably while preventing a shape failure and eliminating the problem of an increase in production cycle time.

Since the oscillating shaft 1241 of the low inertial moving and pressing device 120 is set at a balanced position to balance with an inertia of the frame oscillation shaft 142 of the move frame 143, similar to the bump bonding apparatus 110 of the first embodiment, the capillary 1201 can be moved at high speed by the higher speed moving device 230, the bump form time is shortened and the impact when the melt ball 16 touches the electrode 1031 is suppressed, so that minute bumps can be formed stably and prevented from being defective in shape.

Furthermore, since the cam mechanism is adopted for the structure of the higher speed moving device 230, the voice coil motor and the shift detecting sensor 134 are eliminated from the higher speed moving device. Thus, the device 230 is constituted inexpensively in comparison with the higher speed moving device 130 of the bump bonding apparatus 110 of the first embodiment.

THIRD EMBODIMENT

Figure 6:
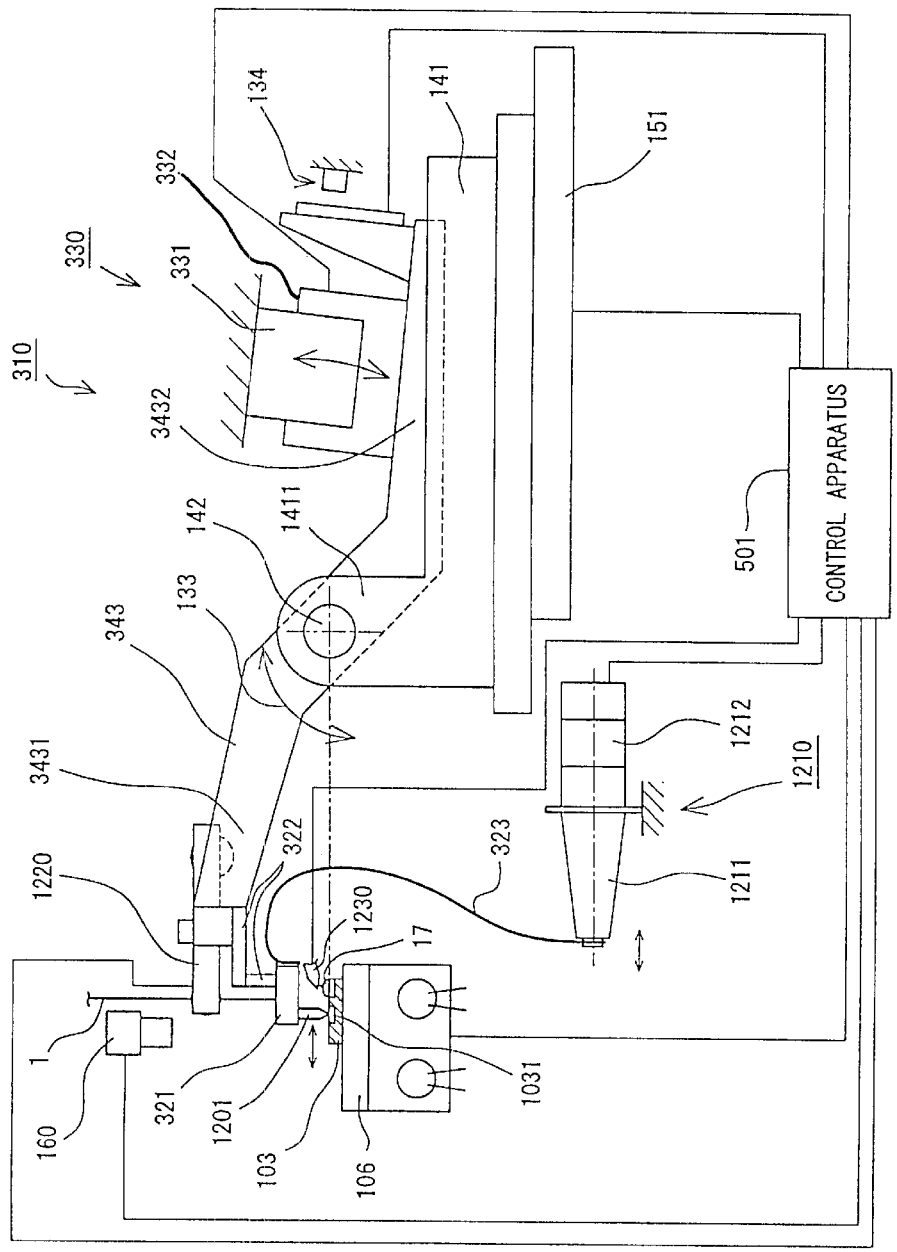
FIG. 6 is a diagram of a bump bonding apparatus according to a third embodiment of the present invention.

FIG. 6 shows a bump bonding apparatus 310 according to a third embodiment. In the bump bonding apparatus 110 of the first embodiment and the bump bonding apparatus 210 of the second embodiment discussed above, in order to reduce the inertial force at the capillary 1201, the higher speed moving device 130, 230, and the low inertial moving and pressing device 120 are provided so as to independently carry out operations of moving the capillary 1201 at high speed and pressing and moving the capillary 1201 with low inertia.

On the other hand, the bump bonding apparatus 310 of the third embodiment eliminates the ultrasonic oscillation device and the device for moving the capillary 1201 from the move frame, with an aim to reduce the inertial force. Thus, in the bump bonding apparatus 310 of the third embodiment, one moving device effectuates high speed movement and low-inertia movement for the move frame as well as a pressing operation by the capillary 1201. A structure of the apparatus 310 will be described below; however, the same parts as in the bump bonding apparatus 110 of the first embodiment are designated by the same reference numerals and the description thereof will be omitted.

According to the bump bonding apparatus 310 in the third embodiment, the damper 1220, an ultrasonic wave transmission part 321, a supporting member 322 and the capillary 1201 are set to one end part 3431 of a move frame 343 that is supported by the frame oscillation shaft 142, and a moving device 330 is set to another end part 3432 of the move frame 343.

The moving device 330 is a device for operating the high-speed movement at a second speed, the low-inertia movement at a first speed, and also the pressing operation as discussed in the first and second embodiments. Similar to the first embodiment, the device 330 includes a voice coil motor with a magnet 331 and a coil 332. The magnet 331 is, for instance, fixed to a frame different from the move frame 343, whereas the coil 332 is set to the move frame 343.

The damper 1220 is set to the one end part 3431 of the move frame 343, to which the ultrasonic wave transmission part 321 is supported via the supporting member 322. The capillary 1201 is set to the ultrasonic wave transmission part 321. Further, to the ultrasonic wave transmission part 321 is connected one end of the ultrasonic horn 1211 via a transmitting member 323. The ultrasonic oscillator 1212 is set to the other end of the ultrasonic horn 1211. That is, the ultrasonic oscillation device 1210 is set separately from the move frame 343.

The transmitting member 323 used in this embodiment has a diameter of 0.3–1 mm and exhibits a sound transmitting velocity of 4500–5500 m/s.

An operation of the bump bonding apparatus 310 of this constitution will be described hereinbelow. An operation for moving the melt ball 16 in the up-down directions and an operation for applying ultrasonic oscillation in the pressing operation, which are specific to the bump bonding apparatus 310 of the third embodiment, will be discussed. The operations equal to those of the bump bonding apparatuses 110, 210 in the first and second embodiments will not be described herein.

The capillary 1201 disposed at the spark generation height 170 is moved at high speed, i.e., the second speed, to the position 171 by rocking the move frame 343 about axis of the frame oscillation shaft 142, by the moving device 330. After the capillary 1201 reaches the position 171, the move frame 343 is moved at the first speed with low inertia by the moving device 330. It is detected that the capillary 1201 reaches the press position 172 when a shift of the move frame 343 detected by the shift detecting sensor 134 rests at a constant value. The moving device 330 provides a predetermined pressing force to the capillary 1201, whereby the melt ball 16 on the electrode 1031 is pressed against the electrode 1031.

During the pressing operation, the ultrasonic oscillation generated by the ultrasonic oscillator 1212 is transmitted to the capillary 1201 through the ultrasonic horn 1211, transmitting member 323 and ultrasonic wave transmission part 321, and applied to the pressed melt ball 16. As a result, the melt ball 16 is joined to the electrode 1031 of the semiconductor integrated circuit 103.

The move frame 343 is rocked by the moving device 330 after this joining, whereby the capillary 1201 is raised by a constant amount to be set to the position 173. The gold wire 1 is then held by the damper 1220, and then the move frame 343 is again rocked by the moving device 330. Consequently, the gold wire 1 is cut at the recrystallization boundary zone, when the projection-like bump 17 is formed on the electrode 1031 of the semiconductor integrated circuit 103. The capillary 1201 then moves up to the spark generation height 170.

As described above, the bump bonding apparatus 310 of the third embodiment is constructed not to have the ultrasonic oscillator 1212 and ultrasonic horn 1211 loaded to the one end part 3431 of the move frame 343. Thus, the ultrasonic oscillator 1212 and the ultrasonic horn 1211 are disposed separately from the move frame 343. An inertia of a head part including the capillary 1201 at the one end part 3431 of the move frame 343 can hence be reduced, and the head part can be moved up and down at high speed, thereby shortening the bump form time. Further, the impact when the melt ball 16 comes into contact with the electrode 1031 can be restricted. Accordingly, minute bumps can be formed stably and prevented from being defective in shape.

Although the moving device 330 according to the third embodiment includes the voice coil motor, a cam mechanism is employable as in the second embodiment.

FOURTH EMBODIMENT

Figure 7:
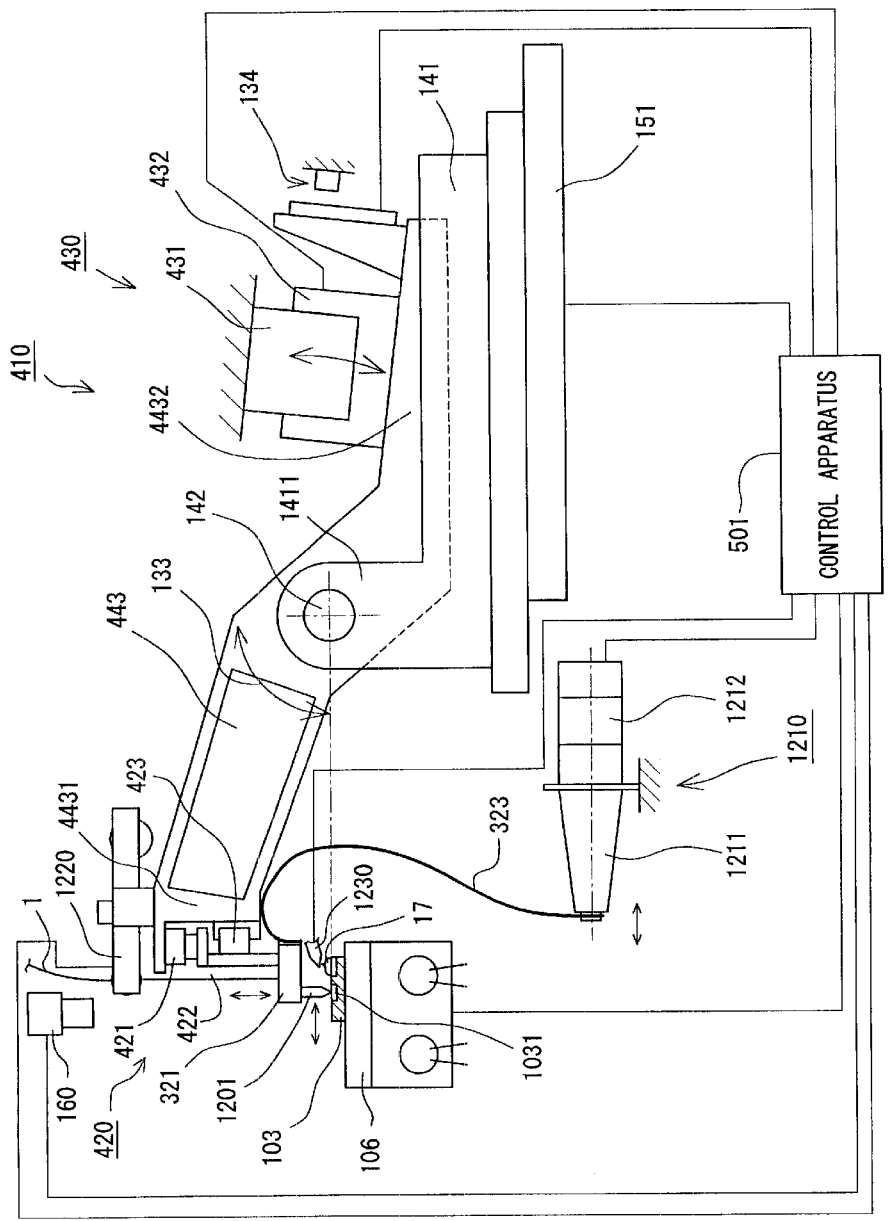
FIG. 7 is a diagram of a bump bonding apparatus according to a fourth embodiment of the present invention.

FIG. 7 shows a bump bonding apparatus 410 according to a fourth embodiment. In the bump bonding apparatus 310 of the foregoing third embodiment, the capillary 1201 set to the one end part 3431 of the move frame 343 is moved by the motion of the move frame 343 and cannot move independently of the motion of the move frame 343. By contrast, the capillary 1201 in the bump bonding apparatus 410 according to the fourth embodiment is rendered movable independently of the motion of the move frame. A specific arrangement of the bump bonding apparatus 410 will now be described below while the same parts in structure as in the bump bonding apparatuses 110, 210, 310 are denoted by the same reference numerals and omitted from the following description.

The bump bonding apparatus 410 has a second low inertial moving and pressing device 420 arranged at one end part 4431 of a move frame 443 that is supported by the frame oscillation shaft 142, with a second higher speed moving device 430 set to another end part 4432.

Figure 8:
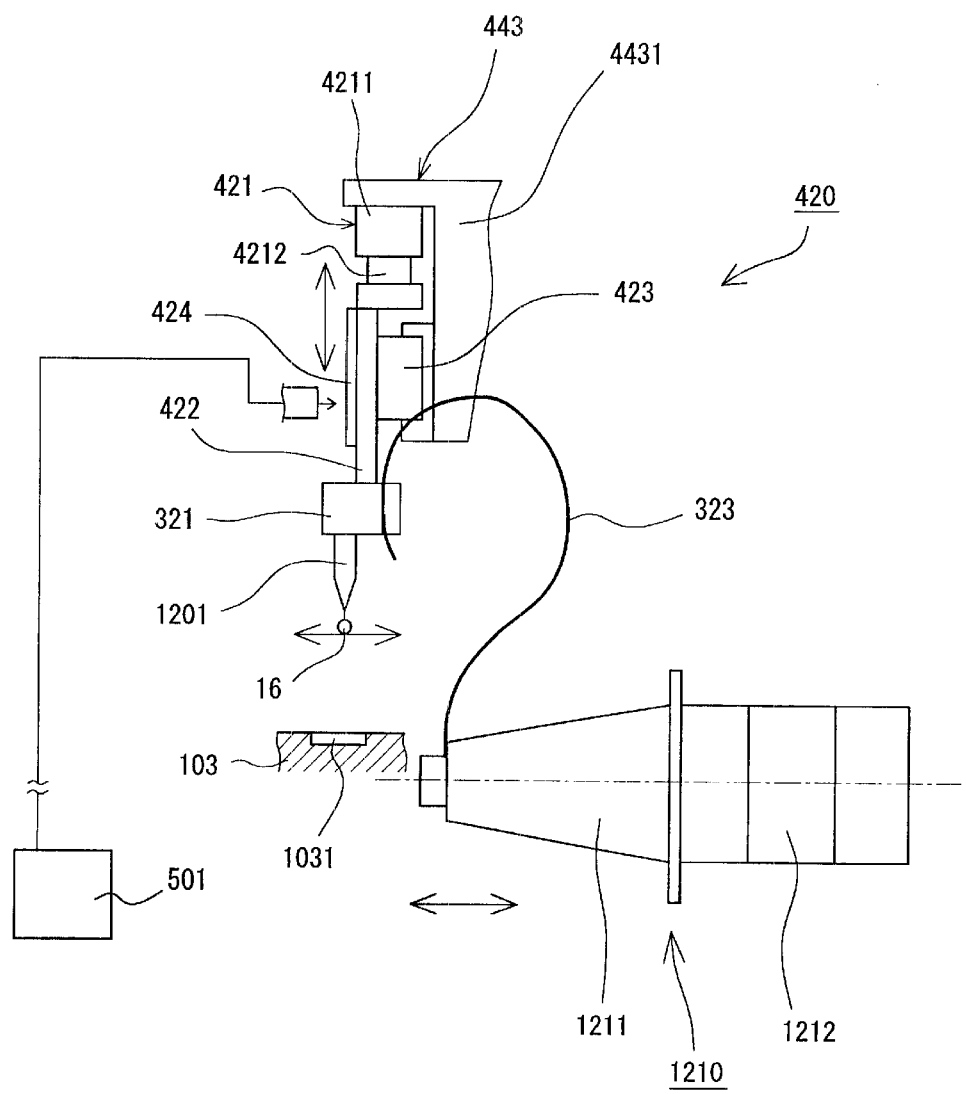
FIG. 8 is an enlarged view of a low inertial moving and pressing device part included in the bump bonding apparatus of FIG. 7.

As is fully indicated in FIG. 8, the second low inertial moving and pressing device 420 includes the damper 1220, a driving part 421, a supporting member 422, a guide mechanism 423, the ultrasonic wave transmission part 321, and the capillary 1201. The clamper 1220 is set to one end part 4431 of the move frame 443. The driving part 421 in the embodiment comprises a voice coil motor, for example, having a magnet 4211 being secured to the one end part 4431. A coil 4212 of the voice coil motor is set to one end of the supporting member 422, which is supported movably in a thicknesswise direction of the semiconductor integrated circuit 103, that is held to the bump formation stage 106, by the guide mechanism 423 mounted to the one end part 4431. The thicknesswise direction is nearly in the up-down direction. A shift detecting sensor 424 is arranged for detecting an amount of movement of supporting member 422, namely, an amount of the movement of the capillary 1201. The ultrasonic transmission part 321 with the capillary 1201 is set to the other end part of the supporting member 422. An air tensioner (not shown) for pulling up the gold wire 1 is arranged above the damper 1220.

The second low inertial moving and pressing device 420 constructed as above is a device in which the low inertia motion with a first speed, and the pressing operation, are performed similar to the manner by which they are performed by the low inertial moving and pressing device 120 in the bump bonding apparatus 110 of the earlier discussed first embodiment.

The second higher speed moving device 430 in the present embodiment comprises a voice coil motor, similar to the higher speed moving device 130 of the bump bonding apparatus 110 of the first embodiment, having a magnet 431 and a coil 432 to drive the move frame 443 at the high second speed. In other words, the capillary 1201 of the second low inertial moving and pressing device 420 set to the one end part 4431 of the move frame 443 is moved at the second high speed from the spark generation height 170 to the position 171.

An operation of the bump bonding apparatus 410 of the fourth embodiment with the above constitution will be discussed below. An operation of moving the melt ball 16 in the up-down directions and pressing the melt ball 16, which is specific to the bump bonding apparatus 410, will be described hereinbelow, and the same operations as in the bump bonding apparatuses 110, 210, 310 of the above first–third embodiments will be omitted.

The capillary 1201 disposed at the spark generation height position 170 is moved at the second high speed to the position 171 by rocking the move frame 443 about the axis of the frame oscillation shaft 142, by the second higher speed moving device 430. After the capillary 1201 reaches the position 171, the supporting member 422, i.e., the capillary 1201 is moved with low inertia at the first speed while being guided by the guide mechanism 423 through an operation of the driving part 421 of the second low inertial moving and pressing device 420. It is detected that the capillary 1201 reaches the press position 172 as a result of the above low inertial movement when a shift of the supporting member 422 detected by the shift detecting sensor 424 stops at a fixed value. A predetermined pressing force is applied to the capillary 1201 by the driving part 421 of the second low inertial moving and pressing device 420, whereby the melt ball 16 above the electrode 1031 is pressed against the electrode 1031.

During the pressing, ultrasonic oscillation generated by the ultrasonic oscillator 1212 is transmitted to the capillary 1201 through the ultrasonic horn 1211, transmitting member 323 and ultrasonic transmission part 321, and applied to the pressed melt ball 16. Accordingly, the melt ball 16 is joined to the electrode 1031 of the semiconductor integrated circuit 103.

After the joining of the melt ball 16, the move frame 443 is rocked by operations of the second higher speed moving device 430 and the driving part 421 of the second low inertial moving and pressing device 420, whereby the capillary 1201 is moved a predetermined distance and brought to the position 173. The gold wire 1 is then held by the damper 1220 and the move frame 443 is rocked by the second higher speed moving device 430. The gold wire 1 is then cut at the recrystallization boundary zone as a result of the rocking operation, and consequently, the projection-shaped bump 17 is formed on the electrode 1031 of the semiconductor integrated circuit 103. Then, the capillary 1201 is moved up to the spark generation height 170.

According to the bump bonding apparatus 410 of the fourth embodiment, similar to the bump bonding apparatus 110 of the earlier first embodiment, moving the capillary 1201 at high speed and moving and pressing the capillary 1201 with low inertia are carried out independently and separately by the second higher speed moving device 430 and the second low inertial moving and pressing device 420. Also, the ultrasonic oscillator 1212 and the ultrasonic horn 1211 are set outside the low inertial moving and pressing device 420. Therefore, the inertia at the second low inertial moving and pressing device 420 is reduced, and an impact force when the melt ball 16 touches the electrode 1031 of the semiconductor integrated circuit 103 is restricted. Thus, minute bumps can be stably formed and prevented from being defective in shape. As above, since the impact force is restricted while the high speed motion is effectuated, the problem of an increase in production cycle time is eliminated.

Although the second higher speed moving device 430 includes the voice coil motor according to the fourth embodiment, the device can include a cam mechanism as in the second embodiment.

FIFTH EMBODIMENT

Figure 10:
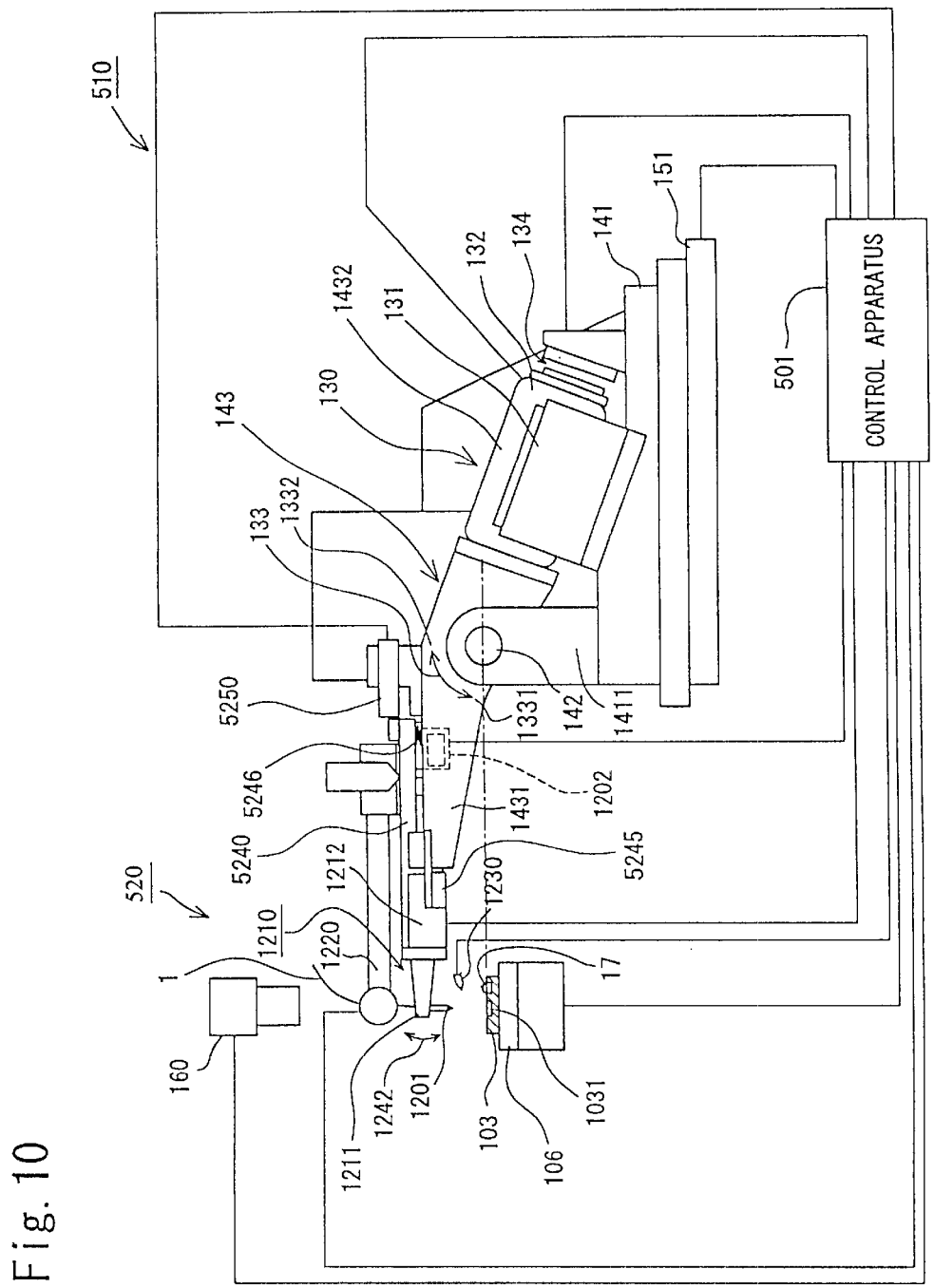
FIG. 10 is a diagram of a bump bonding apparatus according to a fifth embodiment of the present invention.

FIG. 10, a bump bonding apparatus 510 according to a fifth embodiment is shown. The bump bonding apparatus 510 has a low inertial moving and pressing device 520 which is a modification of the low inertial moving and pressing device 120. Thus, a description below is directed to the low inertial moving and pressing device 520, while an explanation related to the other structure of the bump bonding apparatus 510 is omitted from the description. Also, in the low inertial moving and pressing device 520, parts performing the same functions as in the low inertial moving and pressing device 120 are designated by the same reference numerals and the description thereof will be omitted.

The low inertial moving and pressing device 520 has basically the same structure as that of the low inertial moving and pressing device 120, and, has the capillary 1201, the driving part 1202, the ultrasonic oscillation device 1210, and the damper 1220. The ultrasonic oscillation device 1210 has the ultrasonic horn 1211 and the ultrasonic oscillator 1212. The capillary 1201, the ultrasonic oscillation device 1210, and the clamper 1220 are set to a supporting frame 5240 of the low inertial moving and pressing device 520. The supporting frame 5240 corresponds to the supporting frame 1240 of the first embodiment.

On the other hand, differences between the low inertial moving and pressing device 520 and the low inertial moving and pressing device 120 are described below. As described above, the shift detecting sensor 1250 in the first embodiment detects the amount of the shift of the supporting frame 1240 in the up-down directions. On the other hand, a detecting sensor 5250 in the fifth embodiment performs an ON-OFF operation in that the sensor 5250 outputs a signal only when the supporting frame 5240 is moved at least a predetermined distance, and does not carry out detection of a shift amount of the supporting frame 5240. The detecting sensor 5250 is disposed on the move frame 143 in the fifth embodiment. Further, the supporting frame 5240 is set to the one end part 1431 of the move frame 143 via a leaf spring 5245. Thus, the oscillating shaft 1241 in the first embodiment is not provided in the fifth embodiment, and the supporting frame 5240 can rock in the direction of arrow 1242 with pivoting of the leaf spring 5245. Accordingly, the leaf spring 5245 corresponds to the oscillating shaft 1241 and performs a similar function as that of the oscillating shaft 1241. Further, in order to prevent the low inertial moving and pressing device 520 from rocking when the supporting frame 5240 is rocked at the second speed by the higher speed moving device 130, a spring 5246 is set at a gap between the supporting frame 5240 and the move frame 143.

Figure 11:
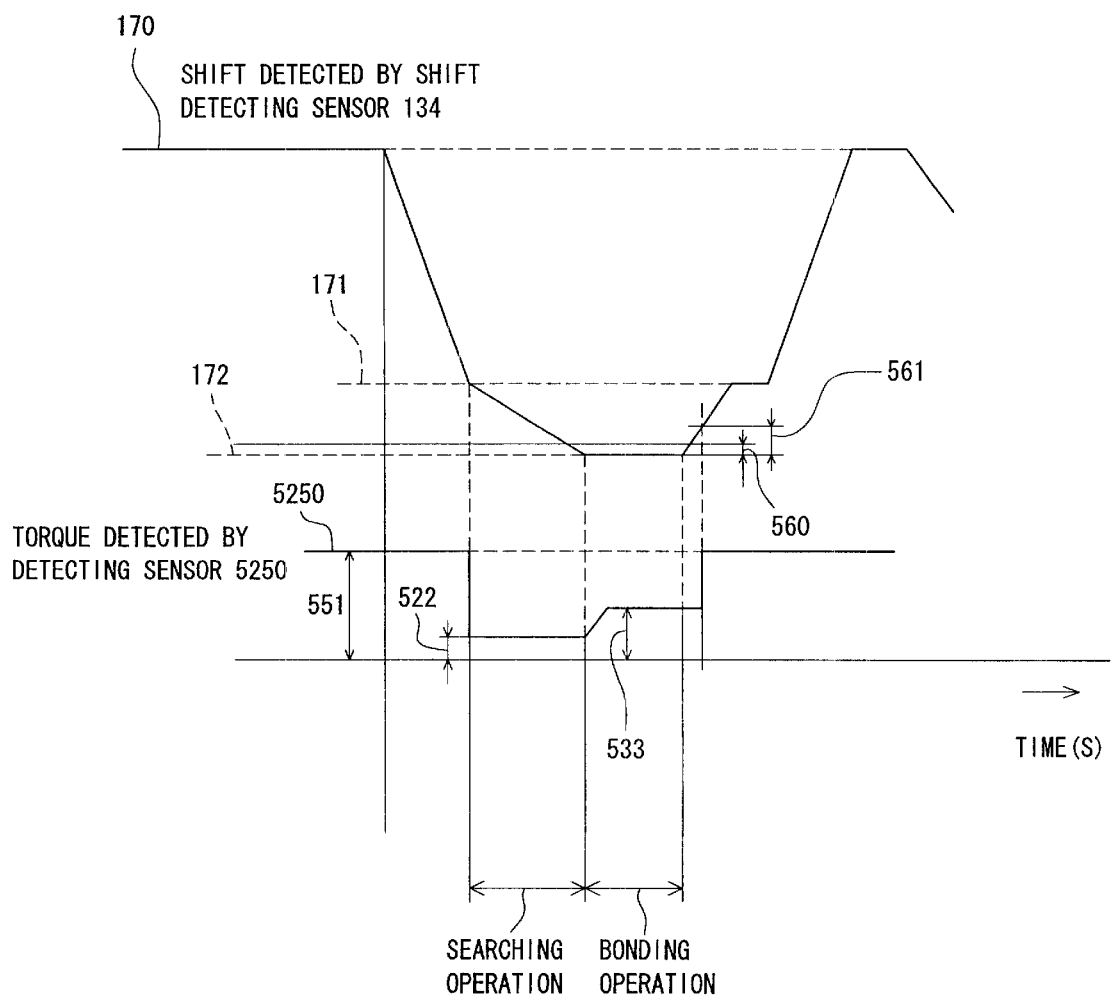
FIG. 11 is a diagram of a move locus of a capillary in a bump bonding operation carried out by the bump bonding apparatus of FIG. 10.

Operation of the bump bonding apparatus 510 of the above constitution will be described with reference to FIG. 11. Controlling operations for each of the constructions of the bump bonding apparatus 510 is executed by the control apparatus 501. The description below is directed to operations related to the higher speed moving device 130 and the low inertial moving and pressing device 520, while the other operations similar to the operations in the bump bonding apparatus 110 of the first embodiment are omitted from the description.

After forming the melt ball 16, the capillary 1201 of the low inertial moving and pressing device 520 disposed at the one end part 1431 of the move frame 143 is moved with high speed, i.e. the second speed, from the spark generation height 170 to the position 171 when the higher speed moving device 130 is operated. During the motion, the driving part 1202 of the low inertial moving and pressing device 520 produces a high torque such that the supporting frame 5240 is not rocked. Thus, the rocking of the supporting frame 5240 is restricted. The high torque corresponds to a high load 551.

When the capillary 1201 reaches the position 171, a torque produced by the driving part 1202 is changed to a torque of a searching load which is smaller than the high torque. The searching load 552 is a load to detect that the melt ball 16 comes into contact with the electrode 1031 and is then pressed onto the electrode 1031. A searching operation described below is carried out with the searching load 552 applied to the capillary 1201.

Next, after the capillary 1201 reaches the position 171, by operating the higher speed moving device 130, the move frame 143, i.e. the capillary 1201 is further lowered to the press position 172 at a lower speed than the second speed. Thus, the melt ball 16 comes into contact with the electrode 1031 and is then pressed onto the electrode 1031. Due to the pressing motion, the supporting frame 5240 of the low inertial moving and pressing device 520 is rocked oppos- ingly to the torque for the searching load 552 in the direction of the arrow 1242 with the leaf spring 5245 serving as a fulcrum. A movement of the supporting frame 5240 due to the rocking motion is detected by the detecting sensor 5250. A distance from the contacting the electrode 1031 to the pressing the melt ball 16 is about 10–50 $\mu$m.

When the movement of the supporting frame 5240 with the predetermined distance is detected by the detecting sensor 5250, i.e. when the capillary 1201 reaches the position 172, an operation of the low inertial moving and pressing device 520 is changed from the searching operation to a bonding operation. When the operation of the device 520 is changed to the bonding operation, the torque produced by the driving part 1202 is changed to a torque of a bonding load 553 which is higher than the searching load 552. Then, the bonding load 553 is applied to the melt ball 16 until the bonding operation is completed, and the melt ball 16 is pressed onto the electrode 1031 and then formed to a bump.

After completing the bonding operation, the higher speed moving device 130 is operated again, whereby the capillary 1201 is raised a predetermined distance. During this motion, the torque of the bonding load 553 is produced by the driving part 1202 of the low inertial moving and pressing device 520.

When raising the predetermined distance is completed, or when a predetermined time has elapsed from the completion of the bonding operation, the torque produced by the driving part 1202 of the low inertial moving and pressing device 520 is changed from the torque for the bonding load 553 to the high torque. Therefore, the rocking motion of the supporting frame 5240 is restricted. Thereafter, as described in the first embodiment, after the clamping operation of the gold wire 1 and the cutting operation are carried out, the forming operation of the melt ball 16 is carried out again.

According to the bump bonding apparatus 510 of the fifth embodiment, similar to the bump bonding apparatus 110 of the earlier first embodiment, the impact force can be restricted when the melt ball 16 comes into contact with the electrode 1031. Accordingly, minute bumps can be stably formed, and can be prevented from being defective in shape while being improved in quality. Moreover, since the higher speed moving device 130 moves the capillary 1201 at high speed from the spark generation height 170 to the position 171, the problem of an increase in production cycle time is eliminated. Further, in the fifth embodiment, since the detecting sensor 5250 performing the ON-OFF operation is provided instead of the shift detecting sensor 1250 in the first embodiment, simplification of the controlling operation performed by the control apparatus 501 can be accomplished.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A bonding apparatus comprising:
   a wire guide member for guiding a wire from which is to be produced a melt ball;
   a move frame having a frame oscillation shaft;
   a moving and pressing device for pressing and joining the melt ball to an electrode of a semiconductor integrated circuit, said moving and pressing device being connected to said move frame;
   a driving part for moving said moving and pressing device relative to said move frame; and
   a moving device for moving said move frame about an axis of said frame oscillation shaft,
   wherein said moving and pressing device is arranged so as to balance with said frame oscillation shaft in terms of inertia.

2. The bonding apparatus according to claim 1, wherein said moving and pressing device includes an ultrasonic oscillation device connected to said wire guide member for ultrasonically oscillating the melt ball via said wire guide member.

3. The bonding apparatus according to claim 2, wherein said moving device is arranged at an end of said move frame and includes a cam mechanism for rocking said move frame about the axis of said frame oscillation shaft.

4. The bonding apparatus according to claim 3, wherein said wire guide member is arranged at another end of said move frame.

5. The bonding apparatus according to claim 1, further comprising:
an ultrasonic oscillation device for generating ultrasonic oscillation, said ultrasonic oscillation device being separate from said move frame; and
a transmitting member for transmitting the ultrasonic oscillation to said wire guide member.

6. The bonding apparatus according to claim 5, wherein said moving device is arranged at an end of said move frame and includes a cam mechanism for rocking said move frame about the axis of said frame oscillation shaft.

7. The bonding apparatus according to claim 6, wherein said wire guide member is arranged at another end of said move frame.

8. The bonding apparatus according to claim 7, wherein said transmitting member has a diameter of from 0.3 mm to 1.0 mm, and exhibits a sound transmitting velocity of from 4600 m/s to 5500 m/s.

9. The bonding apparatus according to claim 6, wherein said transmitting member has a diameter of from 0.3 mm to 1.0 mm, and exhibits a sound transmitting velocity of from 4600 m/s to 5500 m/s.

10. The bonding apparatus according to claim 5, wherein said transmitting member has a diameter of from 0.3 mm to 1.0 mm, and exhibits a sound transmitting velocity of from 4600 m/s to 5500 m/s.

11. The bonding apparatus according to claim 1, wherein said moving device is for moving said move frame about the axis of said frame oscillation shaft at a speed that is greater than a speed at which said moving and pressing device is to be moved by said driving part.

12. The bonding apparatus according to claim 11, wherein said moving and pressing device includes an ultrasonic oscillation device connected to said wire guide member for ultrasonically oscillating the melt ball via said wire guide member.

13. The bonding apparatus according to claim 12, wherein said moving device is arranged at an end of said move frame and includes a cam mechanism for rocking said move frame about the axis of said frame oscillation shaft.

14. The bonding apparatus according to claim 13, wherein said wire guide member is arranged at another end of said move frame.

15. The bonding apparatus according to claim 11, further comprising:
an ultrasonic oscillation device for generating ultrasonic oscillation, said ultrasonic oscillation device being separate from said move frame; and
a transmitting member for transmitting the ultrasonic oscillation to said wire guide member.

16. The bonding apparatus according to claim 15, wherein said moving device is arranged at an end of said move frame and includes a cam mechanism for rocking said move frame about the axis of said frame oscillation shaft.

17. The bonding apparatus according to claim 16, wherein said wire guide member is arranged at another end of said move frame.

18. The bonding apparatus according to claim 17, wherein said transmitting member has a diameter of from 0.3 mm to 1.0 mm, and exhibits a sound transmitting velocity of from 4600 m/s to 5500 m/s.

19. The bonding apparatus according to claim 16, wherein said transmitting member has a diameter of from 0.3 mm to 1.0 mm, and exhibits a sound transmitting velocity of from 4600 m/s to 5500 m/s.

20. The bonding apparatus according to claim 15, wherein said transmitting member has a diameter of from 0.3 mm to 1.0 mm, and exhibits a sound transmitting velocity of from 4600 m/s to 5500 m/s.

21. A bonding method comprising:
moving a melt ball towards an electrode of a semiconductor integrated circuit until said melt ball reaches a location that corresponds to a position of said melt ball immediately before said melt ball is to contact said electrode, whereby a first inertia is realized; and
after said melt ball reaches said location, moving said melt ball from said location to press and join said melt ball to said electrode, whereby a second inertia is realized,
wherein the mass associated with said first inertia resulting from moving said melt ball to said location is greater than the mass associated with said second inertia resulting from moving said melt ball from said location.

22. The bonding method according claim 21, wherein moving said melt ball to said location comprises operating a move frame, and moving said melt ball from said location comprises operating a moving and pressing device which is arranged so as to balance with said move frame in terms of inertia.

23. The bonding method according to claim 21, wherein moving said melt ball to said location comprises pivoting a move frame and a moving and pressing device, and moving said melt ball from said location comprises pivoting said moving and pressing device relative to said move frame.

24. A bonding method comprising:
operating a move frame to move a melt ball towards an electrode of a semiconductor integrated circuit until said melt ball reaches a location that corresponds to a position of said melt ball immediately before said melt ball is to contact said electrode; and
after said melt ball reaches said location, operating a moving and pressing device to move said melt ball to press and join said melt ball to said electrode,
wherein said moving and pressing device is arranged so as to balance with said move frame in terms of inertia.

25. The bonding method according to claim 24,
wherein operating the move frame to move the melt ball comprises operating said move frame to move said melt ball towards said electrode at a second speed until said melt ball reaches the location that corresponds to the position of said melt ball immediately before said melt ball is to contact said electrode, whereby a second inertia is realized, and
wherein operating the moving and pressing device to move said melt ball comprises operating said moving and pressing device to move said melt ball at a first speed, that is less than said second speed, to press and join said melt ball to said electrode, whereby a first inertia is realized,
with said first inertia resulting from moving said melt ball at said first speed being less than said second inertia resulting from moving said melt ball at said second speed.

26. A bonding apparatus comprising:
- a move frame having a reduced inertial moving and pressing device at one end thereof and a higher speed moving device at another end thereof, said reduced inertial moving and pressing device including a wire guide member at one end thereof and a driving part at another end thereof;
- a frame oscillation shaft for pivotally supporting said move frame;
- a support shaft for pivotally supporting said reduced inertial moving and pressing device relative to said move frame, said support shaft being positioned so as to balance with said frame oscillation shaft in terms of inertia; and
- a control device for controlling said higher speed moving device so as to cause said move frame to pivot about an axis of said frame oscillation shaft until a melt ball at a leading end of a wire that projects from said wire guide member reaches a location that corresponds to the position of the melt ball immediately before the melt ball is to contact an electrode of a semiconductor integrated circuit, and for controlling said drive part, after the melt ball reaches the location, so as to cause said reduced inertial moving and pressing device to pivot about an axis of said support shaft such that said wire guide member together with the melt ball moves toward the electrode in order to press and join the melt ball to the electrode.

27. The bonding apparatus according to claim 26, wherein said control device is for controlling said driving part such that said wire guide member together with the melt ball moves toward the electrode at a speed that is less than a speed at which said move frame pivots about the axis of said frame oscillation shaft.

* * * * *